(12) United States Patent
Li et al.

(10) Patent No.: US 9,960,200 B1
(45) Date of Patent: May 1, 2018

(54) SELECTIVE DEPOSITION AND PLANARIZATION FOR A CMOS IMAGE SENSOR

(71) Applicant: Taiwan Semiconductor Manufacturing Co., Ltd., Hsin-Chu (TW)

(72) Inventors: Sheng-Chan Li, Tainan (TW); Cheng-Hsien Chou, Tainan (TW); Sheng-Chau Chen, Tainan (TW); Cheng-Yuan Tsai, Chu-Pei (TW); Chih-Hui Huang, Yongkang (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/337,328

(22) Filed: Oct. 28, 2016

(51) Int. Cl.
*H01L 31/0232* (2014.01)
*H01L 27/146* (2006.01)

(52) U.S. Cl.
CPC ...... *H01L 27/1464* (2013.01); *H01L 27/1463* (2013.01); *H01L 27/14625* (2013.01); *H01L 27/14636* (2013.01); *H01L 27/14685* (2013.01); *H01L 27/14687* (2013.01); *H01L 27/14689* (2013.01)

(58) Field of Classification Search
CPC .......... H01L 27/14685; H01L 27/1464; H01L 27/14625; H01L 27/14636; H01L 27/1463; H01L 27/14687; H01L 27/14678

USPC ....................................................... 257/432
See application file for complete search history.

(56) References Cited

U.S. PATENT DOCUMENTS

2013/0069190 A1* 3/2013 Kao ............... H01L 27/1463
257/432

OTHER PUBLICATIONS

Venezia, et al. "Stack Chip Technology: A New Direction for CMOS Imagers." 2015 International Image Sensor Workshop (IISW), Jun. 8, 2015 in Vaals, The Netherlands.

* cited by examiner

*Primary Examiner* — Theresa T Doan
(74) *Attorney, Agent, or Firm* — Eschweiler & Potashnik, LLC

(57) ABSTRACT

The present application relates to a method to simplify the scribe line opening filling processes, and to further improve the surface uniformity of the conductive pad fabrication process. A passivation layer is formed over a semiconductor substrate, and a scribe line opening is formed through the passivation layer and the semiconductor substrate. To fill the scribe line opening, a first dielectric layer is formed within the scribe line opening over the conductive pad and extending over the passivation layer. The first dielectric layer is formed by a selective deposition process such that the first dielectric layer is formed on the conductive pad at a deposition rate greater than that formed on the passivation layer.

20 Claims, 9 Drawing Sheets

Fig. 1

SELECTIVE DEPOSITION AND PLANARIZATION FOR A CMOS IMAGE SENSOR

BACKGROUND

Many modern day electronic devices include optical imaging devices (e.g., digital cameras) that use image sensors. Image sensors convert optical images to digital data that may represent the images. An image sensor may include an array of pixel sensors and supporting logic. The pixel sensors measure incident radiation (e.g., light), and the supporting logic facilitates readout of the measurements. One type of image sensor commonly used in optical imaging devices is a back-side illumination (BSI) complementary metal-oxide-semiconductor (CMOS) image sensor. BSI CMOS image sensors advantageously have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
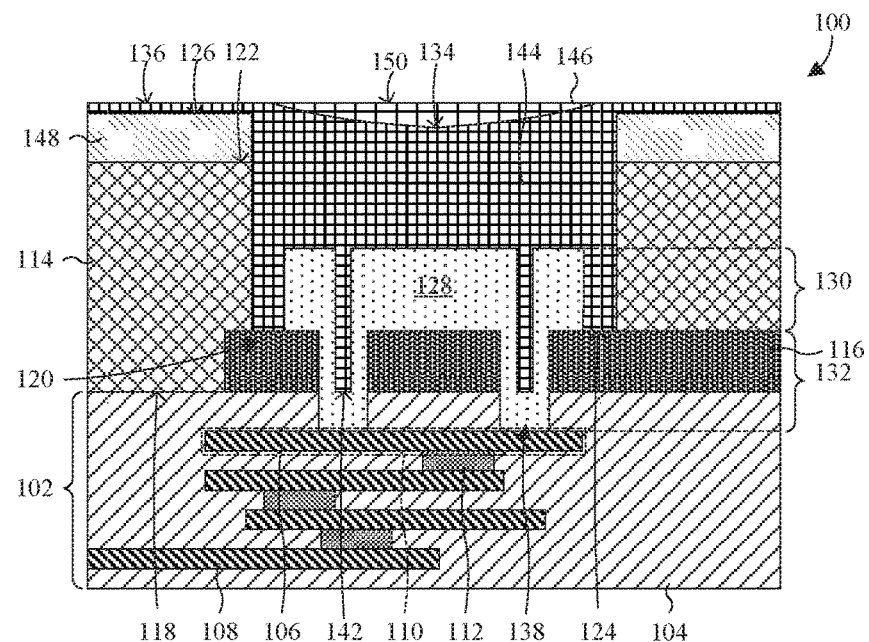
FIG. 1 illustrates a cross-sectional view of some embodiments of an integrated chip having a conductive pad structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide-semiconductor (CMOS) image sensors include an array of pixels sensors arranged within a semiconductor substrate of an integrated circuit (IC). An array of color filters is arranged over the pixel sensor array and buried within a light-receiving side of the IC. Burying the color filter array within the integrated circuit advantageously improves the optical performance of the image sensors. For example, one or more of cross talk, quantum efficiency, and SNR-X (i.e., minimum luminance to achieve a signal-to-noise ratio (SNR) of X, such as 10) may be improved. While burying the color filter array provides improved optical performance, integrating the buried color filter array (BCFA) process with existing CMOS image sensor processes during manufacture poses challenges. For example, a conductive pad is formed in a scribe line opening on the light-receiving side of the IC before forming the BCFA. The scribe line opening creates discontinuities on the surface of the light-receiving side of the IC. A limitation of the BCFA process is that it is dependent upon the light-receiving side of the IC having a surface that is substantially planar. Failure to have a substantially planar surface may negatively affect optical performance. To form a planar surface for the BCFA process, a series of dielectric layers are deposited over the conductive pad to fill the scribe line opening. These dielectric layers may be produced through a series of deposition and etching processes such as un-doped silicate glass (USG) deposition processes, high density plasma (HDP) sputtering processes, and resist protective oxide (RPO) deposition processes. Besides the plasma damage introduced by some of these deposition and etching processes, the depth of the scribe line opening may introduce a high aspect ratio for subsequent planarization processes. An additional photolithography process may be needed to remove or at least lower the heights of the filling dielectric layers outside of the scribe line opening. Further etching processes may also be needed before performing the BCFA process.

The present application relates to a method for integrating a conductive pad process with a BCFA process during the manufacture of an image sensor. The method simplifies the scribe line opening filling processes, eliminates damage caused by the deposition and etching processes, and further improves the surface uniformity of the conductive pad structure and associated semiconductor devices. In some embodiments, a passivation layer is formed over a semiconductor substrate and a scribe line opening is formed through the passivation layer and the semiconductor substrate. Then, a conductive pad is formed within the scribe line opening which electrically contacts a metal line of a BEOL metallization stack. To fill the scribe line opening, a first dielectric layer is formed within the scribe line opening over the conductive pad and extending over the passivation layer. The first dielectric layer is formed by a selective deposition process. The first dielectric layer is formed on the conductive pad at a deposition rate greater than that formed on the passivation layer. By utilizing the selective deposition process to fill the scribe line opening after forming the conductive pad structure, the deposition and planarization process is simplified since the selective filling process reduces the aspect ratio of the first dielectric layer before being planarized. Further, the surface uniformity is improved for subsequent BCFA formation and optical performance is advantageously improved as well.

With reference to FIG. 1, a cross-sectional view 100 of some embodiments of an integrated chip having a conductive pad structure is provided. The conductive pad structure includes a BEOL metallization stack 102. The BEOL metallization stack 102 includes metal lines (e.g. 106, 108) electrically coupled to one another by vias 112 and stacked within an interlayer dielectric (ILD) layer 104. The ILD layer 104 may be, for example, a low κ dielectric (i.e., a dielectric with a dielectric constant less than about 3.9) or an oxide. The metal lines include an upper metallization layer 110. The metal lines 106, 108 and the vias 112 may comprise a metal material such as aluminum copper, aluminum, germanium, copper, tungsten or some other metal. A semiconductor substrate 114 and an isolation region 116 are arranged over the BEOL metallization stack 102. In some embodiments, the isolation region 116 abuts an upper surface 118 of the BEOL metallization stack 102, and extends vertically therefrom into the semiconductor substrate 114. The semiconductor substrate 114 may be, for example, a bulk semiconductor substrate such as a bulk silicon substrate, or a silicon-on-insulator (SOI) substrate. The isolation region 116 may be, for example, a shallow trench isolation (STI) region or an implant isolation region. A passivation layer 148 is disposed over the semiconductor substrate 114. Though shown in FIG. 1 as a single layer, the passivation layer 148 may be, for example, a single or multilayer dielectric film including one or more layers of an oxide such as silicon dioxide, a nitride such as silicon nitride, or a high-k dielectric (i.e., dielectric with a dielectric constant greater than about 3.9). In some embodiments, the passivation layer 148 includes a nitride layer arranged over a pair of oxide layers, which are stacked on opposing sides of a high-k dielectric layer (as shown and described below in FIG. 2). In other embodiments, the passivation layer 148 includes a nitride layer arranged over an oxide layer.

A scribe line opening 120 is disposed through the passivation layer 148, the semiconductor substrate 114, and the isolation region 116. A conductive pad 128 is disposed within the scribe line opening 120. In some embodiments, the conductive pad 128 includes a base region 130 and a protruding region 132 underlying the base region 130. The base region 130 is disposed on the isolation region 116, and has sidewall surfaces laterally spaced from neighboring sidewall surfaces of the semiconductor substrate 114. In some embodiments, the base region 130 has a substantially uniform thickness. Further, in some embodiments, the base region 130 may have a portion of an upper surface 142 recessed below an upper surface 124 of the isolation region 116. The protruding region 132 protrudes through a pair of line-shaped openings 138 in the isolation region 116 and the ILD layer 104, to the upper metallization layer 110 of the metal line 106. The pair of line-shaped openings 138 are laterally spaced apart and extend axially in parallel along a periphery of the base region 130. The conductive pad 128 may comprise, for example, a metal, such as aluminum copper.

A first dielectric layer 144 is arranged over the conductive pad 128, and fills the scribe line opening 120. In some embodiments, the first dielectric layer 144 may have a substantially planar upper surface including a lightly concave upper surface 134 directly above the conductive pad. The first dielectric layer 144 may extend over the passivation layer 148 having a planar upper surface 136 directly above the passivation layer 148 and connected to the concave upper surface 134. In some embodiments, the concave upper surface 134 is recessed below an upper surface 126 of the passivation layer 148, but above an upper surface 122 of the semiconductor substrate 114. In some embodiments, a second dielectric layer 146 is disposed on the concave upper surface 134 of the first dielectric layer 144, and may have an upper surface 150 being substantially aligned with the planar upper surface 136 of the first dielectric layer 144 directly above the passivation layer 148. In some embodiments, the first dielectric layer 144 and the second dielectric layer 146 may comprise the same or different dielectric materials, such as an oxide material. In some embodiments, as a result of forming techniques as described in following paragraphs, the first dielectric layer 144 may comprise an atomic percentage of silicon of from about 40% to about 50%, an atomic percentage of oxygen of from about 50% to about 60%, and an atomic percentage of nitrogen of about 0.2%. Previous filling techniques may result in a different atomic percentage rate of silicon, oxygen and nitrogen. In some embodiments, the first dielectric layer 144 comprises no carbon residue. In some embodiments, the second dielectric layer 146 comprises an un-doped silicate glass (USG) material.

Figure 2:
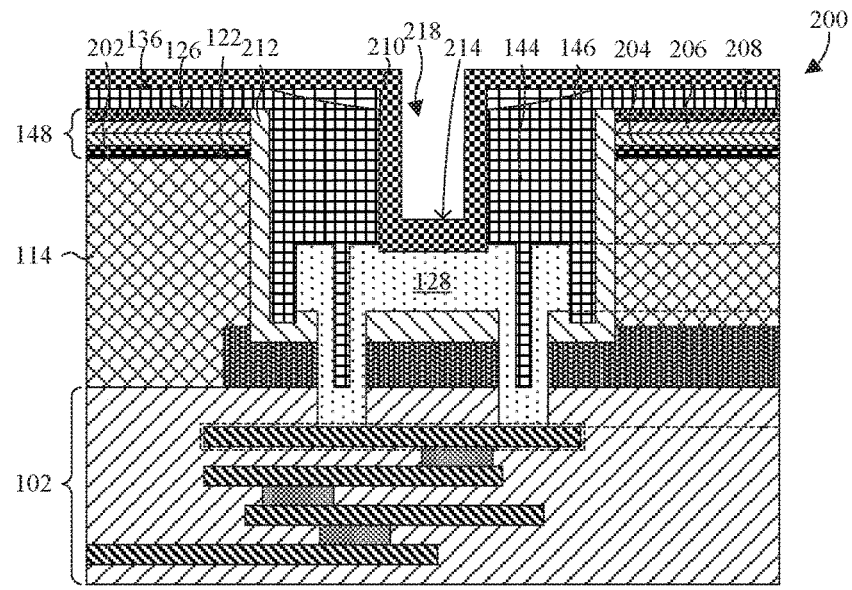
FIG. 2 illustrates a cross-sectional view of some alternative embodiments of an integrated chip having a conductive pad structure with a metal connect layer.

With reference to FIG. 2, a cross-sectional view 200 of some embodiments of an integrated chip having a conductive pad structure is provided. As a non-limiting example, in some embodiments, a buffer layer 212 lines a scribe line opening 120, and supports a conductive pad 128 underneath a peripheral region and a central region of the conductive pad 128. The buffer layer 212 may include a first region lining a recessed surface of the scribe line opening 120 directly under the conductive pad 128, a second region lining sidewall surfaces of the scribe line opening 120, and a third region lining a lateral surface of the scribe line opening 120 between the first and second regions. The buffer layer 212 may be, for example, a dielectric such as silicon dioxide or some other oxide. In some embodiments, a first dielectric layer 144 and/or a second dielectric layer 146 may have upper surfaces being slightly concave or substantially planar. A passivation layer 148 disposed over a semiconductor substrate 114 may includes a first oxide layer 202 arranged over the semiconductor substrate 114, a high-k dielectric layer 204 arranged over the first oxide layer 202, a second oxide layer 206 arranged over the high-k dielectric layer 204, and a nitride layer 208 arranged over the second oxide layer 206. The first and second oxide layers 202 and 206 may be, for example, silicon dioxide. The high-k dielectric layer 204 may be, for example, hafnium oxide (HfO), hafnium silicon oxide (HfSiO), hafnium aluminum oxide (HfAlO), or hafnium tantalum oxide (HMO). The nitride layer 208 may be, for example, silicon nitride. A metal connect layer 210 is arranged over the passivation layer 148, the first dielectric layer 144, and/or the second dielectric layer 146, and fills a pad opening 218. The metal connect layer 210 may be a metal, such as, for example, copper or aluminum copper. Further, the metal connect layer 210 may be conformal or have a recessed upper surface 214 lower than upper surfaces 122, 126 or 136 of the semiconductor substrate 114, the passivation layer 148 or the dielectric layers 144 and 146.

Figure 3:
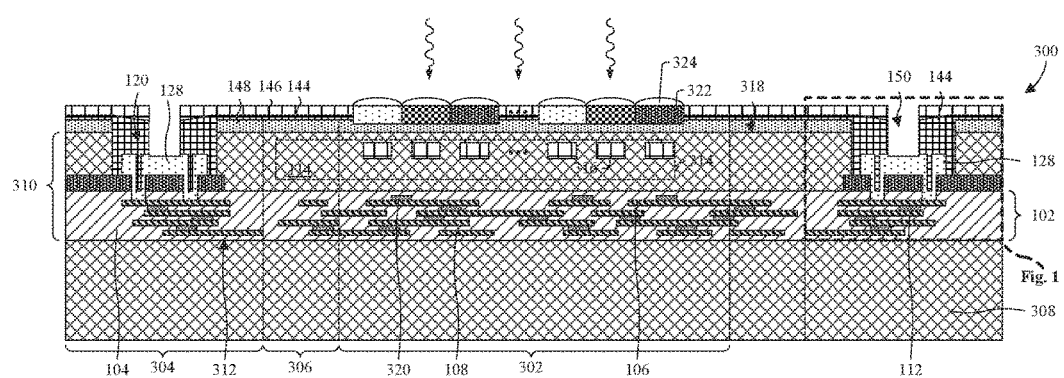
FIG. 3 illustrates a cross-sectional view of some alternative embodiments of an integrated chip having a back-side illumination (BSI) complementary metal-oxide-semiconductor (CMOS) image sensor with a conductive pad structure.

With reference to FIG. 3, a cross-sectional view 300 of some embodiments of a back-side illuminated (BSI) image sensor within which the conductive pad structure finds application is provided. The BSI image sensor includes a sensing region 302, an interconnect region 304, and a logic region 306. The sensing region 302 is configured to sense incident radiation. The interconnect region 304 laterally surrounds the sensing region 302 along an edge of the BSI image sensor, and includes conductive pad structures of FIG. 1 or 2 (illustrated with FIG. 2). The conductive pad structures are laterally spaced around the sensing region 302, and are configured to connect the BSI image sensor to external devices. The logic region 306 may laterally surround the sensing region 302 between the sensing region 302 and the interconnect region 304, and includes logic devices (not shown) configured to support the operation of the BSI image sensor.

The sensing, interconnect, and logic regions 302, 304, 306 are arranged within a carrier substrate 308 and an IC 310. The carrier substrate 308 may be, for example, a bulk semiconductor substrate, such as a bulk silicon substrate, or a SOI substrate. The IC 310 is arranged over the carrier substrate 308 and is bonded or attached by other techniques to the carrier substrate 308 through a front side 312 of the IC 310. The IC 310 includes a device region 314 arranged between a semiconductor substrate 114 and a BEOL metallization stack 102. The BEOL metallization stack 102 is arranged along the front side 312 of the IC 310, and includes an ILD layer 104 and metal lines 106 and 108 stacked within the ILD layer 104. Contacts 320 electrically couple the device region 314 to the metal lines 106 and 108, and vias 112 electrically couple the metal lines 106 and 108 to one another. The device region 314 includes electronic components, such as, for example, one or more of transistors, capacitors, resistors, inductors, photodetectors, and photodiodes. Within the sensing region 302, the device region 314 typically includes an array of pixel sensors 316, such as photodetectors and/or photodiodes. Within the logic region 306, the device region 314 typically includes transistors (not shown).

The passivation layer 148 lines an upper surface of the semiconductor substrate 114 and is not extended into a scribe line opening 120. The first and second dielectric layers 144 and 146 fill in the scribe line opening 120. Although not visible, the scribe line opening 120 may extend to have a footprint laterally surrounds the sensing region 302. In some embodiments, a conductive pad 128 is disposed within the scribe line opening 120. The conductive pad 128 may be coupled to a metal connect layer (not shown) disposed within a pad opening 218 through the first and second dielectric layers 144 and 146. A color filter array 322 is buried within a passivation layer 148 and/or other dielectric layers (e.g. first and second dielectric layers 144, 146) within the sensing region 302 along a backside 318 of the semiconductor substrate 114 and opposed to the BEOL metallization stack 102. The color filter array 322 corresponds to the pixel sensors 316 and is assigned corresponding colors or wavelengths of radiation (e.g., light). Further, the color filter array 322 is configured to transmit the assigned colors or wavelengths of radiation to the corresponding pixel sensors 316. Typically, the color filter assignments alternate between red, green, and blue. In some embodiments, the color filter assignments alternative between red, green, and blue light of a Bayer mosaic. An array of microlenses 324 is arranged over the color filter array 322 and the pixel sensors 316. The microlenses 324 have centers that are typically aligned with centers of the color filter array 322 and/or centers of the pixel sensors 316. The microlenses 324 are configured to focus incident radiation towards the pixel sensors 316 and/or the color filter array 322. In some embodiments, the microlenses 324 have convex upper surfaces configured to focus radiation towards the pixel sensors 316 and/or the color filter array 322.

FIGS. 4-15 illustrate a series of cross-sectional view showing some embodiments of an integrated chip having a conductive pad structure at various stages of manufacture.

Figure 4:
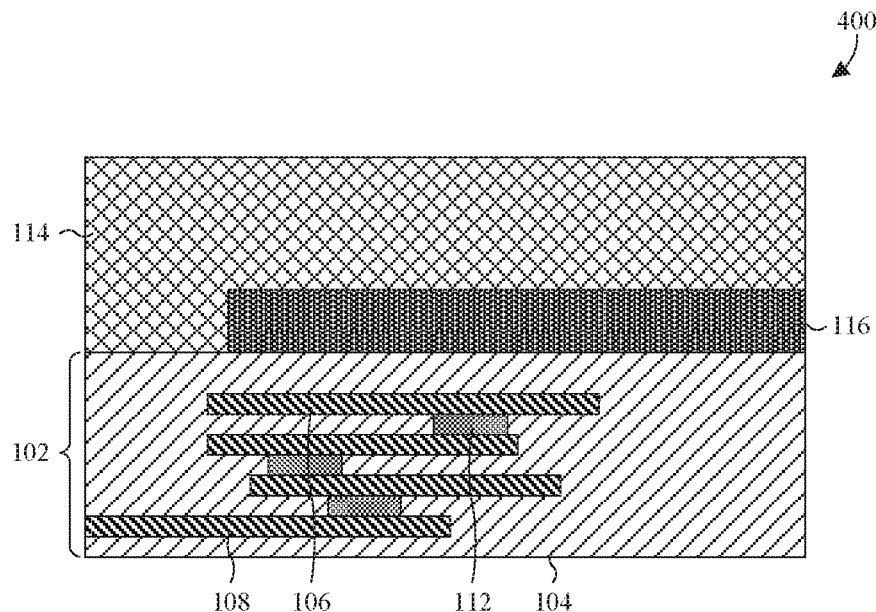
FIGS. 4-15 illustrate a series of cross-sectional views of some embodiments of an integrated chip having a conductive pad structure at various stages of manufacture.

As shown in cross-sectional view 400 of FIG. 4, a semiconductor substrate 114 is arranged over an isolation region 116 and a BEOL metallization stack 102. The semiconductor substrate 114 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, a plurality of semiconductor devices can be formed within and/or over the semiconductor substrate 114. The isolation region 116 may be, for example, an STI region. The BEOL metallization stack 102 includes metal lines 106, 108 stacked within an ILD layer 104 and electrically coupled to one another by vias 112. The ILD layer 104 may be, for example, a low κ dielectric or an oxide. The metal lines 106, 108 and the vias 112 may be, for example, a metal. In some embodiments, the isolation region 116 is deposited along a back side of the semiconductor substrate 114. The BEOL metallization stack 102 is then formed over the isolation region 116 and the semiconductor substrate 114 by forming trench and via openings within the ILD layer 104, which is selectively exposed to an etchant (e.g., $CF_4$, $CHF_3$, $C_4F_8$, HF, etc.) that etches the ILD layer 104, followed by filling a conductive metal material such as copper, aluminum, tungsten, etc. into the trench and via openings. In some embodiments, a chemical mechanical polishing (CMP) process may be used to remove excess of the metal material from an upper surface of the ILD layer 104. The semiconductor substrate 114 is then flipped over for following processes.

Figure 5:
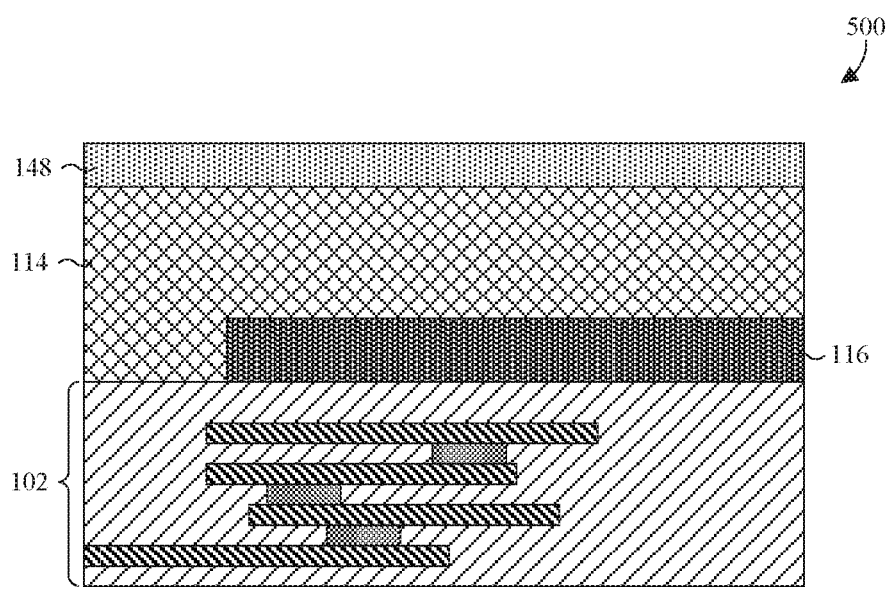

As shown in cross-sectional view 500 of FIG. 5, a passivation layer 148 is formed along a front side of the semiconductor substrate 114 opposed to the BEOL metallization stack 102. The passivation layer 148 may be formed as, for example, a single or multilayer dielectric film including one or more layers of oxide, nitride, and high-k dielectric. The one or more layers may be formed by sequentially depositing the layers using vapor deposition, thermal oxidation, spin coating, or any other suitable deposition technique.

Figure 6:
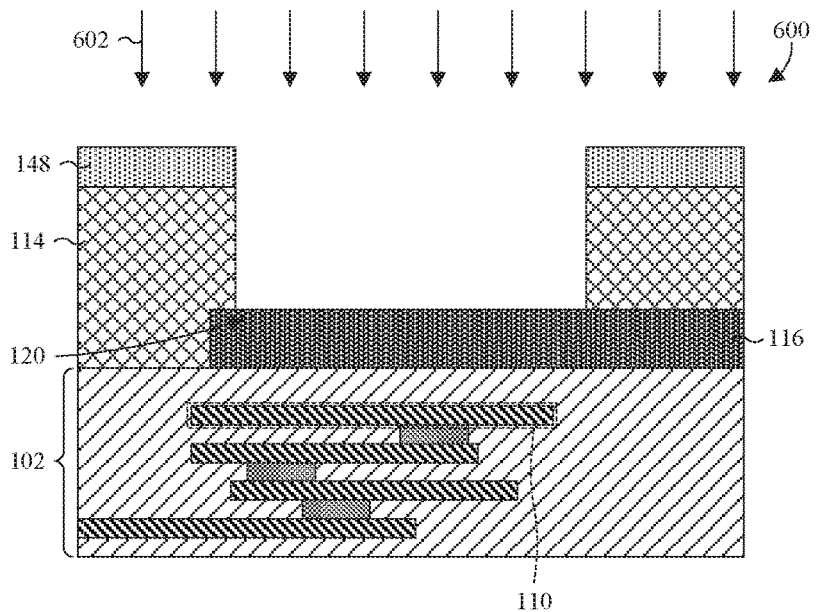

As shown in cross-sectional view 600 of FIG. 6, an etch process is performed into the passivation layer 148 and the semiconductor substrate 114, through a select region overlying an upper metallization layer 110, to the isolation region 116 (see FIG. 6). In some embodiments, due to over etching, the isolation region 116 may be eroded under the select region. The etch process results in a scribe line opening 120 overlying the upper metallization layer 110. The process for performing the etch process may include forming a photoresist layer masking regions of the semiconductor substrate 114 laterally surrounding the select region. Then, a first etchant 602 may be applied to the semiconductor substrate 114 of a pattern of the photoresist layer 502. Thereafter, the first photoresist layer may be removed. Though not shown in FIG. 6, in some embodiments, a buffer layer (e.g. the buffer layer 212 shown in FIG. 2) can be conformally formed and patterned after forming the scribe line opening 120.

Figure 7:
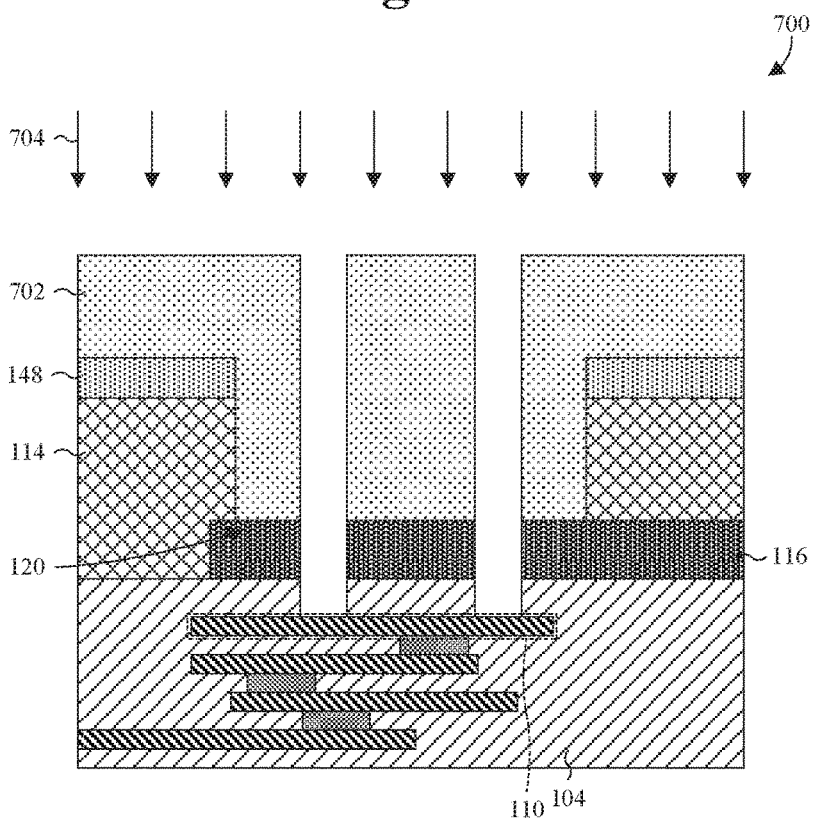

As shown in cross-sectional view 700 of FIG. 7, an etch process is performed into the isolation region 116 and the ILD layer 104, through select regions, to form an opening to expose the upper metallization layer 110. The select regions are laterally spaced apart and extend axially in parallel along the periphery of the scribe line opening 120. The process for performing the etch process may include forming a second photoresist layer 702 masking regions of the isolation region 116 laterally surrounding the select regions. Further, one or more second etchants 704 may be applied to the isolation region 116 and the ILD layer 104 of a pattern of the second photoresist layer 702. Thereafter, the second photoresist layer 702 may be removed.

Figure 8:
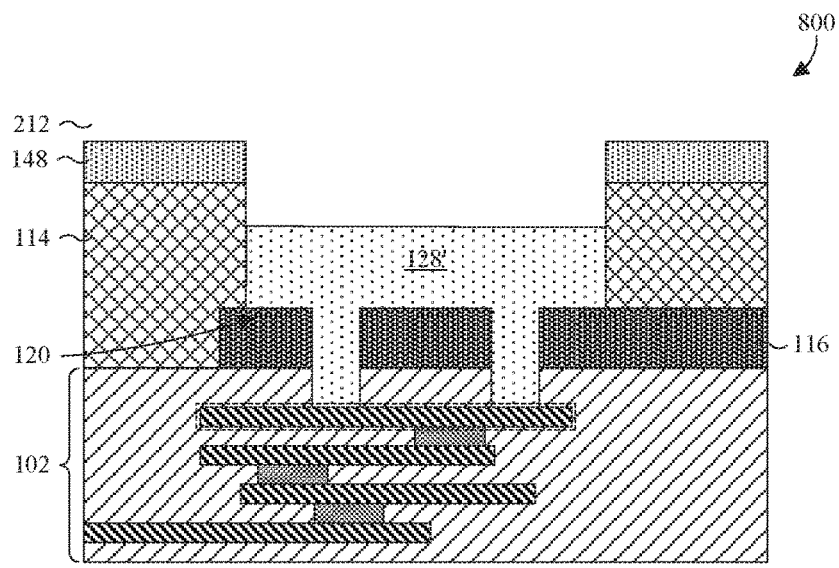

As shown in cross-sectional view 800 of FIG. 8, a conductive pad layer 128' is formed over the isolation region 116, fully filling the opening formed by the etch process of FIG. 7 and partially filling the scribe line opening 120. The conductive pad layer 128' may be formed of, for example, a metal, such as aluminum copper, copper, aluminum, or some other metal. In some embodiments, the conductive pad layer 128' may be formed using a plating process (e.g., an electroplating process or an electro-less plating process) or a deposition process (e.g., chemical vapor deposition (CVD), physical vapor deposition (PVD), atomic layer deposition (ALD), etc.), followed by an etch back process.

Figure 9:
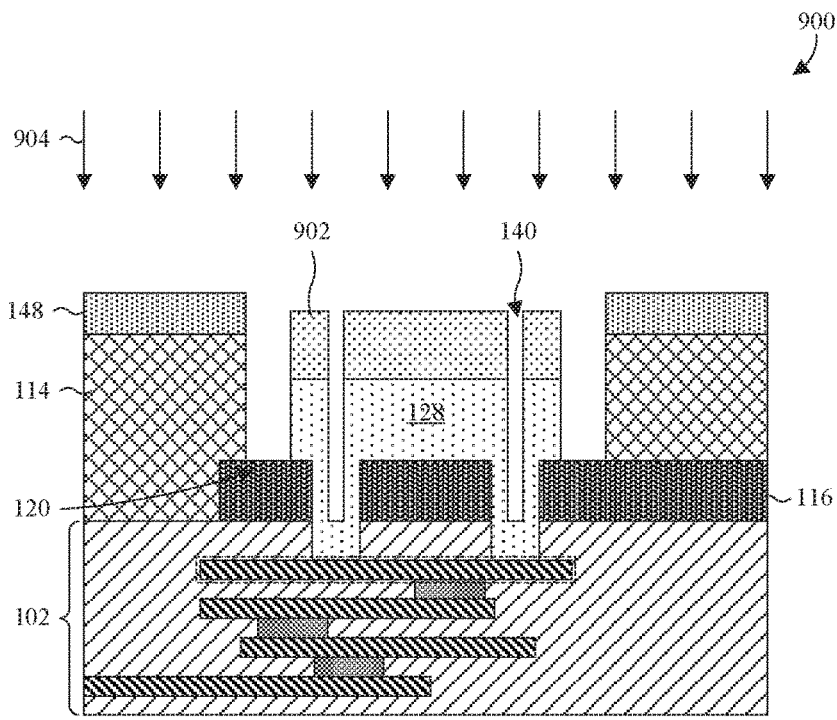

As shown in cross-sectional view 900 of FIG. 9, an etch process may be performed into the conductive pad layer 128' (shown in FIG. 8) to form a conductive pad 128. The etch process results in the conductive pad 128 having sidewall surfaces laterally spaced from neighboring sidewall surfaces of the semiconductor substrate 114. Further, the conductive pad 128 has a pair of openings including recessed upper surfaces. The process for performing the etch process may include forming a third photoresist layer 902 masking regions of the conductive pad layer 128' laterally surrounding the select regions. Further, a third etchant 904 may be applied to the conductive pad layer 128' of a pattern of the third photoresist layer 902. Thereafter, the third photoresist layer 902 may be removed.

Figure 10:
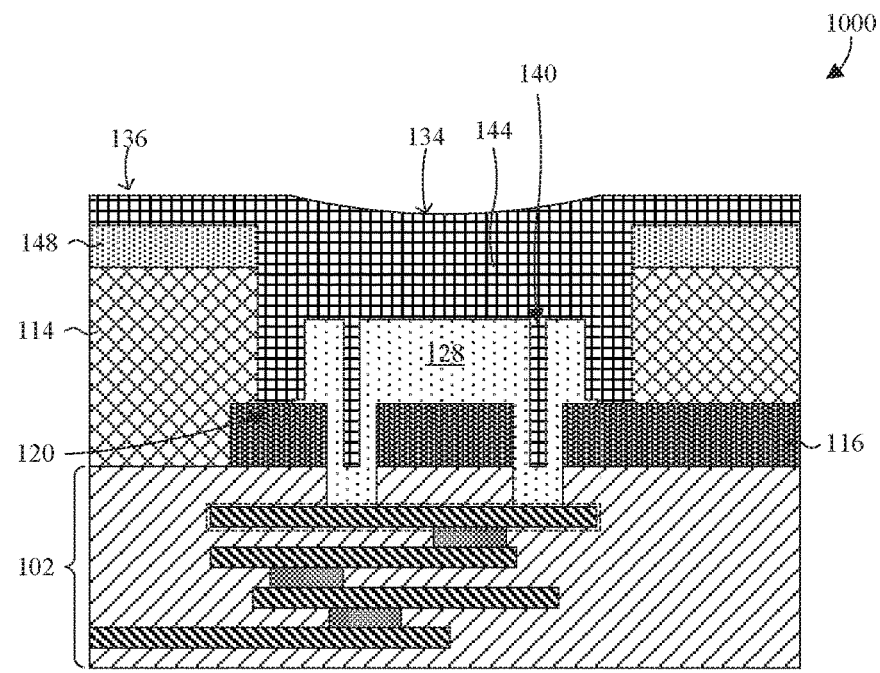

As shown in cross-sectional view 1000 of FIG. 10, a first dielectric layer 144 is formed over the passivation layer 148, the isolation region 116 and the conductive pad 128, and fills a remaining portion of the scribe line opening 120. The first dielectric layer 144 is formed by a selective deposition process. The first dielectric layer 144 is formed on the conductive pad 128 at a deposition rate greater than that formed on the passivation layer 148. In some embodiments, the first dielectric layer 144 is deposited on the conductive pad 128 and the semiconductor substrate 114 at deposition rates that are four times or greater than deposited on the passivation layer. In some embodiments, the first dielectric layer is formed by coating a spin on oxide material. For example, a PHPS (Per Hydro Poly Silazane) polymer is formed within the scribe line opening 120 (carried by a solvent) and then oxidized to form the first dielectric layer 144. In some other embodiments, the first dielectric layer is formed by a sub-atmospheric chemical vapor deposition (SACVD) process. As a result, the scribe line opening 120 is filled seamlessly without raising a significant dielectric height outside the scribe line opening 120, which would help a planarization process to be performed. In some embodiments, the selective deposition process is followed by an annealing process that derives Silane (SiH4), Ammonia (NH3) and hydrogen (H2) gases. The first dielectric layer 144 may be formed as, for example, an oxide, such as silicon dioxide, or some other dielectric.

Figure 11:
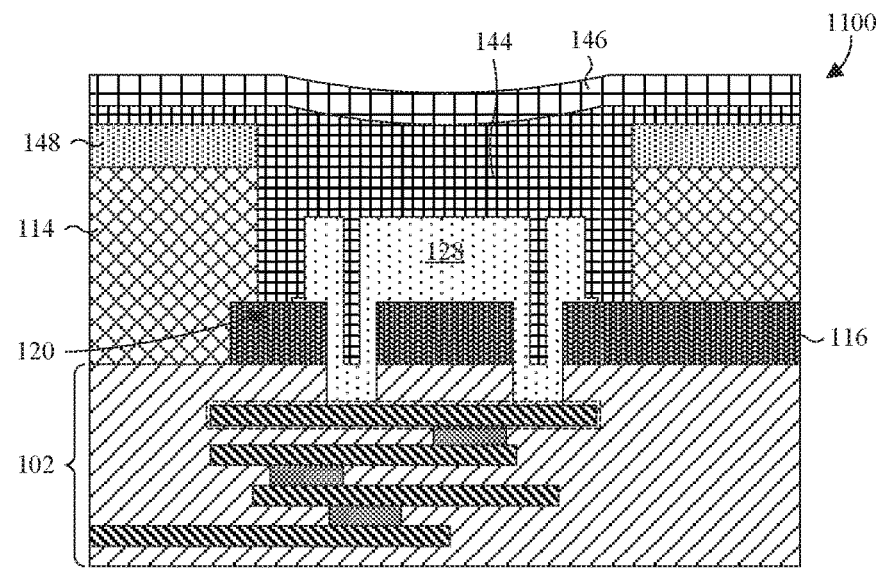

As shown in cross-sectional view 1100 of FIG. 11, a second dielectric layer 146 may be formed by depositing an un-doped silicate glass (USG) material on the first dielectric layer 144. The second dielectric layer 146 can be formed by a deposition process (e.g., chemical vapor deposition (CVD), physical vapor deposition (PVD), atomic layer deposition (ALD), etc.).

Figure 12:
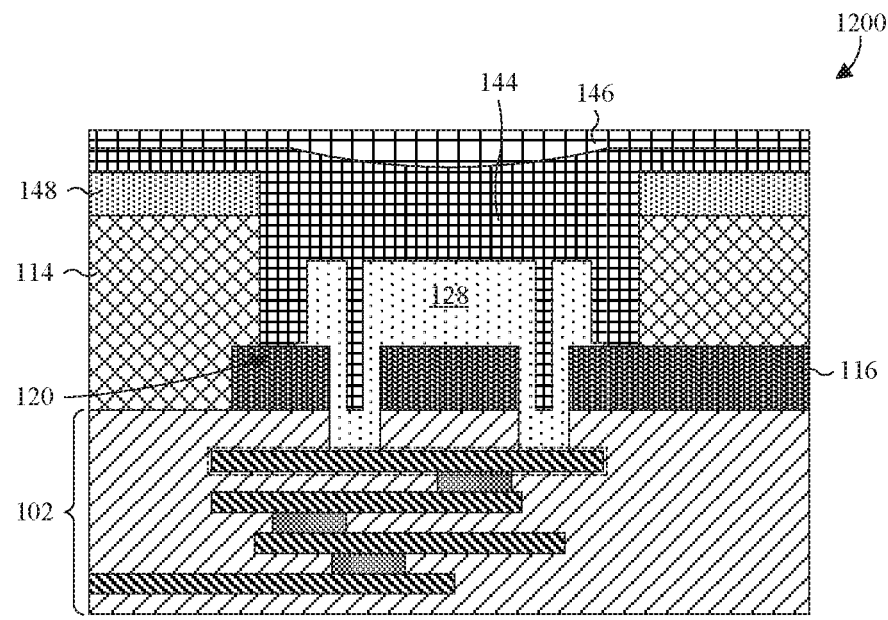

As shown in cross-sectional view 1200 of FIG. 12, the second dielectric layer 146 is planarized by a planarization process, such as a chemical mechanical polishing (CMP) process, to remove an upper portion of the USG material. In some embodiments, a planar upper surface of the second dielectric layer 146 is achieved across the scribe line and peripheral regions as shown in FIG. 12. In some alternative embodiments not shown by FIG. 12, the second dielectric layer 146 overlying the passivation layer 148 is substantially removed such that only a portion of the second dielectric layer 146 lower than an upper surface of the passivation layer 148 is left, such as directly on a concave upper surface of the first dielectric layer 144. In this case, an upper surface of the second dielectric layer 146 is substantially aligned with an upper surface of the first dielectric layer 144 directly above the passivation layer 148.

Figure 13:
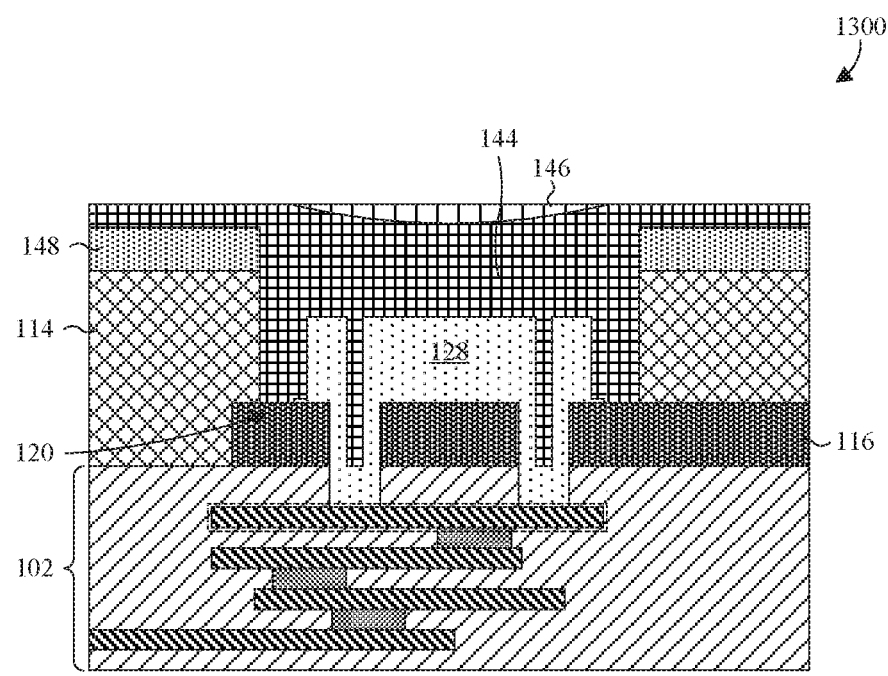

As shown in cross-sectional view 1300 of FIG. 13, a wet etch process is preformed into the second dielectric layer 146 and/or the first dielectric layer 144 to clean the work piece surfaces and to further etch back an upper surface of the first and/or second dielectric layers 144 and 146 to be substantially planar.

Figure 14:
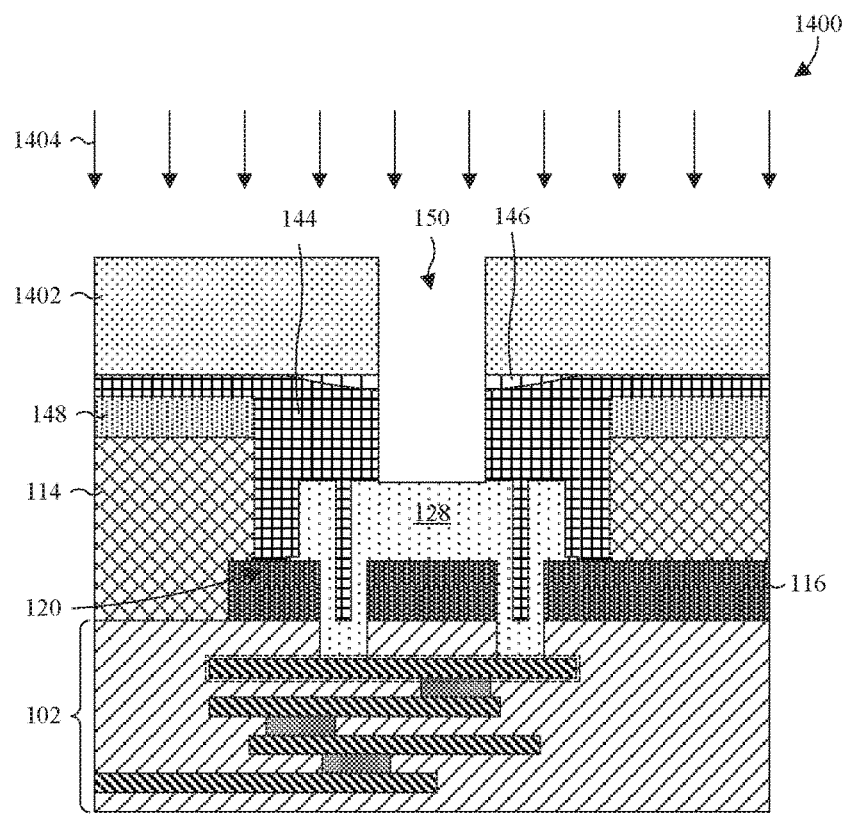

As shown in cross-sectional view 1400 of FIG. 14, an etch process is performed into the first dielectric layer 144 and the second dielectric layer 146 through select regions overlying the conductive pad 128. In some embodiments, due to over etching, the conductive pad 128 may be eroded under the select regions. The etch process results in a pad opening 218 overlying and exposing the conductive pad 128. The process for performing the etch process may include forming a fourth photoresist layer 1402 by masking regions of the first dielectric layer 144 and the second dielectric layer 146 laterally surrounding the select regions. Further, a fifth etchant 1404 may be applied to the first dielectric layer 144 and the second dielectric layer 146 of a pattern of the fourth photoresist layer 1402. Thereafter, the fourth photoresist layer 1402 may be removed.

Figure 15:
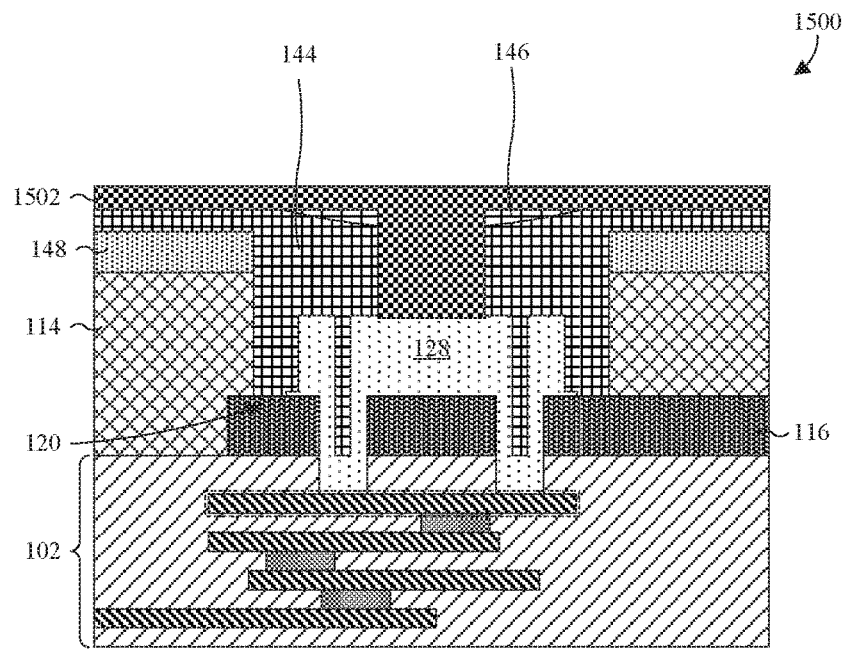

As shown in cross-sectional view 1500 of FIG. 15, a metal connect layer 1502 is formed over the first dielectric layer 144 and the second dielectric layer 146 and filling the pad opening 218. The metal connect layer 1502 may be formed of, for example, a metal, such as copper or aluminum copper. Further, the metal connect layer 1502 may be formed using, for example, vapor deposition, spin coating, or any other suitable deposition technique. In some embodiments, the metal connect layer 1502 can be formed conformally. (not shown).

Figure 16:
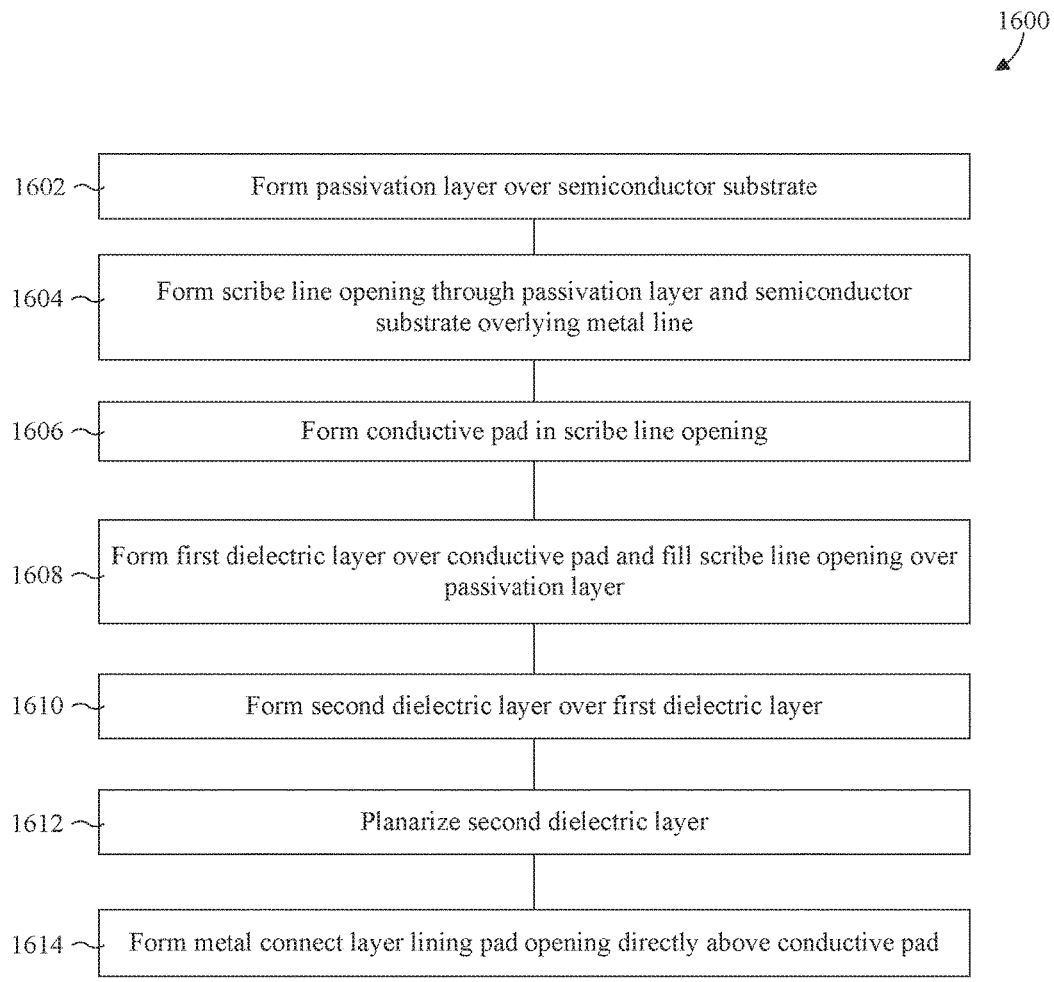
FIG. 16 illustrates a flowchart of some embodiments of a method for manufacturing an integrated chip having a conductive pad structure.

FIG. 16 illustrates some embodiments of a method 1600 for manufacturing an integrated chip having a conductive pad structure. Although method 1600 is described in relation to FIGS. 4-15, it will be appreciated that the method 1600 is not limited to such structures disclosed in FIGS. 4-15, but instead may stand alone independent of the structures disclosed in FIGS. 4-15. Similarly, it will be appreciated that the structures disclosed in FIGS. 4-15 are not limited to the method 1600, but instead may stand alone as structures independent of the method 1600. Also, while the disclosed methods (e.g., method 1600) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, a passivation layer is formed over a semiconductor substrate. In some embodiments, an isolation region is deposited along a back side of the semiconductor substrate. A BEOL metallization stack is formed over the semiconductor substrate. The semiconductor substrate is then flipped over, and a passivation layer is formed along a front side of the semiconductor substrate opposing to the BEOL metallization stack. The passivation layer may be formed as, for example, a single or multilayer dielectric film including one or more layers of oxide, nitride, and high-k dielectric. FIGS. 4-5 illustrate some embodiments of cross-sectional views 400 and 500 corresponding to act 1602.

At 1604, a scribe line opening is formed through the passivation layer and the semiconductor substrate overlying a metal line. In some embodiments, an etch process is performed into the passivation layer and the semiconductor substrate to form the scribe line opening overlying a metal line. Then, a second etch process is performed into the isolation region and the ILD layer to form an opening to expose the metal line. FIGS. 6-7 illustrate some embodiments of cross-sectional views 600 and 700 corresponding to act 1604.

At 1606, a conductive pad is formed in the scribe line opening. In some embodiments, a conductive pad layer is formed over the isolation region, fully filling the opening formed by the second etch process and partially filling the scribe line opening. The conductive pad layer is then patterned to form a conductive pad. The etch process results in the conductive pad having sidewall surfaces laterally spaced from neighboring sidewall surfaces of the semiconductor substrate. Further, the conductive pad may have a pair of openings including recessed upper surfaces. FIGS. 8-9 illustrate some embodiments of cross-sectional views 800 and 900 corresponding to act 1606.

At 1608, a first dielectric layer is formed over the conductive pad and fills the scribe line opening over the passivation layer. In some embodiments, the first dielectric layer is formed over the passivation layer, the isolation region and the conductive pad and fills a remaining portion of the scribe line opening. The first dielectric layer is formed by a selective deposition process. The first dielectric layer is formed on the conductive pad at a deposition rate greater than that formed on the passivation layer. FIG. 10 illustrates some embodiments of a cross-sectional view 1000 corresponding to act 1608.

At 1610, a second dielectric layer is formed over the first dielectric layer and extends over the passivation layer. In some embodiments, the second dielectric layer may be formed by depositing an un-doped silicate glass (USG) material on the first dielectric layer. FIG. 11 illustrates some embodiments of a cross-sectional view 1100 corresponding to act 1610.

At 1612, the second dielectric layer is planarized. In some embodiments, the second dielectric layer is planarized by a planarization process, such as a chemical mechanical polishing (CMP) process, to remove an upper portion of the second dielectric material. In some embodiments, a planar upper surface of the second dielectric layer is achieved across the scribe line region and the peripheral regions. In some alternative embodiments, the second dielectric layer overlying the passivation layer is substantially removed such that only a portion of the second dielectric layer lower than an upper surface of the passivation layer is left, such as directly on a concave upper surface of the first dielectric layer. A wet etch process is then preformed into the second dielectric layer and/or the first dielectric layer to clean the work piece surfaces and to further etch back an upper surface of the first and/or second dielectric layers to be substantially planar. FIGS. 12-13 illustrate some embodiments of cross-sectional views 1200 and 1300 corresponding to act 1612.

At 1614, a metal connect layer is formed lining the pad opening directly above the conductive pad. In some embodiments, an etch process is performed into the first dielectric layer and the second dielectric layer to expose the conductive pad. A metal connect layer is formed over the first dielectric layer and the second dielectric layer and filling in the pad opening 218. FIGS. 14-15 illustrate some embodiments of cross-sectional views 1400 and 1500 corresponding to act 1614.

As can be appreciated from the description above, the present disclosure provides a method for integrating a conductive pad process with a BCFA process during the manufacture of an image sensor. The method comprises forming a passivation layer over a semiconductor substrate on a light-receiving side of the contact image sensor and forming a scribe line opening through the passivation layer and the semiconductor substrate. The scribe line opening overlies and exposes a metal line of a back end of line (BEOL) metallization stack. The method further comprises forming a conductive pad within the scribe line opening, which electrically contacts the BEOL metallization stack, and forming a first dielectric layer within the scribe line opening over the conductive pad and extending over the passivation layer. The first dielectric layer is formed by a selective deposition process such that the first dielectric layer is formed on the conductive pad at a deposition rate greater than formed on the passivation layer.

In other embodiments, the present disclosure relates to a conductive pad structure of an image sensor device. The conductive pad structure comprises a semiconductor substrate arranged over a back end of line (BEOL) metallization stack and a passivation layer disposed over the semiconductor substrate. The conductive pad structure further comprises a scribe line opening disposed through the semiconductor substrate and the passivation layer and a conductive pad comprising a base region and a protruding region, the protruding region protruding from the base region into the BEOL metallization stack. The conductive pad structure further comprises a first dielectric layer filling the scribe line opening over the conductive pad, extending over the passivation layer, and having a concave upper surface directly above the conductive pad and a second dielectric layer disposed on the concave upper surface of the first dielectric layer, and having an upper surface being substantially aligned with an upper surface of the first dielectric layer directly above the passivation layer.

In yet other embodiments, the present disclosure provides a method for manufacturing a conductive pad structure of an image sensor device. The method comprises forming a passivation layer over a semiconductor substrate and forming a scribe line opening through the passivation layer and the semiconductor substrate. The scribe line opening overlies and exposes a metal line of a back end of line (BEOL) metallization stack. The method further comprises forming a conductive pad within the scribe line opening, which electrically contacts the BEOL metallization stack. The method further comprises forming a first dielectric layer within the scribe line opening over the conductive pad by a selective deposition process. The first dielectric layer is formed on the conductive pad at a deposition rate greater than the deposition rate on the passivation layer. The method further comprises forming a second dielectric layer on the first dielectric layer, performing a chemical mechanical polish (CMP) into the second dielectric layer, and performing a wet etch process into the second dielectric layer and/or the first dielectric layer to etch back an upper surface of the first and/or second dielectric layer to be substantially planar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a contact image sensor, the method comprising:
    forming a passivation layer over a semiconductor substrate on a light-receiving side of the contact image sensor;
    forming a scribe line opening through the passivation layer and the semiconductor substrate, the scribe line opening overlying and exposing a metal line of a back end of line (BEOL) metallization stack;
    forming a conductive pad within the scribe line opening, which electrically contacts the BEOL metallization stack; and
    forming a first dielectric layer within the scribe line opening over the conductive pad and extending over the passivation layer, wherein the first dielectric layer is formed by a selective deposition process such that the first dielectric layer is formed on the conductive pad at a deposition rate greater than that formed on the passivation layer.

2. The method of claim 1, wherein the first dielectric layer is deposited on the conductive pad and the semiconductor substrate at deposition rates that are four times or greater than depositing on the passivation layer.

3. The method of claim 1, wherein forming the first dielectric layer comprises coating a spin-on oxide material on the conductive pad and the semiconductor substrate.

4. The method of claim 1, wherein the first dielectric layer is formed using a sub-atmospheric chemical vapor deposition (SACVD) process.

5. The method of claim 1, further comprising:
    forming a buffer layer lining the scribe line opening; and
    performing an etch process into a lower surface of the scribe line opening to expose the metal line of the BEOL metallization stack.

6. The method of claim 1, wherein forming the conductive pad comprises:
    forming a conductive layer extending to reach on the metal line of the BEOL metallization stack and partially filling the scribe line opening; and
    performing an etch process into the conductive layer to form the conductive pad.

7. The method of claim 1, further comprising:
    forming a second dielectric layer by depositing an undoped silicate glass (USG) material on the first dielectric layer followed by a planarization process to remove an upper portion of the USG material such that an upper surface of the second dielectric layer is substantially aligned with an upper surface of the first dielectric layer directly above the passivation layer.

8. The method of claim 7, further comprising:
    performing an etch through the first dielectric layer and the second dielectric layer to form a pad opening exposing the conductive pad; and
    forming a metal connect layer into the pad opening lining the first dielectric layer, the second dielectric layer, and the conductive pad.

9. The method of claim 7, further comprising:
    forming an array of color filters through the first dielectric layer and the second dielectric layer in an upper portion of the passivation layer.

10. The method of claim 1, wherein forming the passivation layer comprises:
    forming a first oxide layer along the semiconductor substrate;
    forming a high-k layer with a dielectric constant exceeding about 3.9 on the first oxide layer;
    forming a second oxide layer on the high-k layer; and
    forming a nitride layer on the second oxide layer.

11. A method for manufacturing a contact image sensor, the method comprising:
    forming a passivation layer over a semiconductor substrate;
    forming a scribe line opening through the passivation layer and the semiconductor substrate, the scribe line opening overlying and exposing a metal line of a back end of line (BEOL) metallization stack;
    forming a conductive pad within the scribe line opening, which electrically contacts the BEOL metallization stack;
    forming a first dielectric layer within the scribe line opening over the conductive pad by a selective deposition process, wherein the first dielectric layer is formed on the conductive pad at a deposition rate greater than depositing on the passivation layer;
    forming a second dielectric layer on the first dielectric layer;
    performing a chemical mechanical polish (CMP) into the second dielectric layer; and
    performing a wet etch process into the second dielectric layer or the first dielectric layer to etch back an upper surface of the first or second dielectric layer to be substantially planar.

12. A method for manufacturing a contact image sensor, the method comprising:
    forming a passivation layer over a semiconductor substrate on a light-receiving side of the contact image sensor;
    forming a scribe line opening through the passivation layer and the semiconductor substrate, the scribe line opening overlying and exposing a metal line of a back end of line (BEOL) metallization stack;
    forming a conductive pad within the scribe line opening, the conductive pad comprising a base region and a protruding region, the protruding region protruding from the base region into the BEOL metallization stack; and
    forming a first dielectric layer within the scribe line opening over the conductive pad and extending over the passivation layer, wherein the first dielectric layer has a concave upper surface directly above the conductive pad; and forming a second dielectric layer on the concave upper surface of the first dielectric layer, the second dielectric layer having an upper surface being substantially aligned with an upper surface of the first dielectric layer directly above the passivation layer.

13. The method of claim 12, further comprising:
forming an array of pixel sensors in the semiconductor substrate at a position laterally adjacent to the conductive pad to be formed; and
forming an array of color filters buried in the passivation layer over the pixel sensor array.

14. The method of claim 12, further comprising:
forming an isolation region arranged over the BEOL metallization stack and extending into the semiconductor substrate, wherein the protruding region extends through the isolation region to the BEOL metallization stack.

15. The method of claim 12, wherein the first dielectric layer is formed by a selective deposition process such that the first dielectric layer is formed on the conductive pad at a deposition rate greater than that formed on the passivation layer.

16. The method of claim 12, wherein the first dielectric layer is formed to have an atomic percentage of nitrogen of about 0.2% and have no carbon residue.

17. The method of claim 12, wherein the first dielectric layer is formed to have an atomic percentage of silicon of from about 40% to about 50% and an atomic percentage of oxygen of from about 50% to about 60%.

18. The method of claim 12, wherein the conductive pad is formed to have a pair of line-shaped openings that are laterally spaced apart and that extend axially in parallel along a periphery of the base region.

19. The method of claim 12, further comprising:
forming a buffer layer lining the scribe line opening, and including a first region lining a recessed surface of the scribe line opening directly under the conductive pad, a second region lining sidewall surfaces of the scribe line opening, and a third region lining a lateral surface of the scribe line opening between the first and second regions.

20. The method of claim 12, further comprising:
forming a pad opening extending through the first dielectric layer and the second dielectric layer, and exposing the conductive pad; and
forming a metal connect layer over the first and second dielectric layers and lining the conductive pad opening.

* * * * *